United States Patent
Morioka

(10) Patent No.: US 8,552,542 B2
(45) Date of Patent: Oct. 8, 2013

(54) LEAD FRAME, SEMICONDUCTOR DEVICE, METHOD OF MANUFACTURING LEAD FRAME, AND METHOD OF MANUFACTURING SEMICONDUCTOR DEVICE

(75) Inventor: Muneharu Morioka, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/586,301

(22) Filed: Aug. 15, 2012

(65) Prior Publication Data

US 2013/0069214 A1    Mar. 21, 2013

(30) Foreign Application Priority Data

Sep. 21, 2011 (JP) ................. 2011-205521

(51) Int. Cl.
*H01L 23/495* (2006.01)

(52) U.S. Cl.
USPC ............................ 257/676; 257/666; 438/123

(58) Field of Classification Search
USPC ................... 257/666, 676, 797; 438/111, 123
See application file for complete search history.

(56) References Cited

U.S. PATENT DOCUMENTS

| 6,518,657 | B2 * | 2/2003 | Hanada et al. | 257/692 |
| 7,291,900 | B2 * | 11/2007 | Corisis et al. | 257/666 |
| 2008/0067639 | A1 * | 3/2008 | Do et al. | 257/666 |
| 2008/0067644 | A1 * | 3/2008 | Johnson | 257/666 |
| 2013/0020691 | A1 * | 1/2013 | Danno et al. | 257/676 |

FOREIGN PATENT DOCUMENTS

| JP | 5-36739 | 2/1993 |
| JP | 2001-127236 | 5/2001 |
| JP | 2003-124365 | 4/2003 |
| JP | 2004-193189 | 7/2004 |

* cited by examiner

*Primary Examiner* — S. V. Clark
(74) *Attorney, Agent, or Firm* — Young & Thompson

(57) ABSTRACT

A lead frame or semiconductor device and a method of manufacturing the same in which where the unit lead frame of each semiconductor device after dicing was located in a lead frame before dicing can be known without an additional manufacturing step. The lead frame includes a plurality of unit lead frames each having a die pad, suspension leads coupled to the die pad, and leads formed around the die pad. An identification mark including at least one of a penetrating groove, recess, and convex is formed in at least one of the die pad, suspension leads, and leads. The identification mark of a first unit lead frame and the identification mark of a second unit lead frame are different from each other at least either in location in the unit lead frame or in shape.

23 Claims, 16 Drawing Sheets

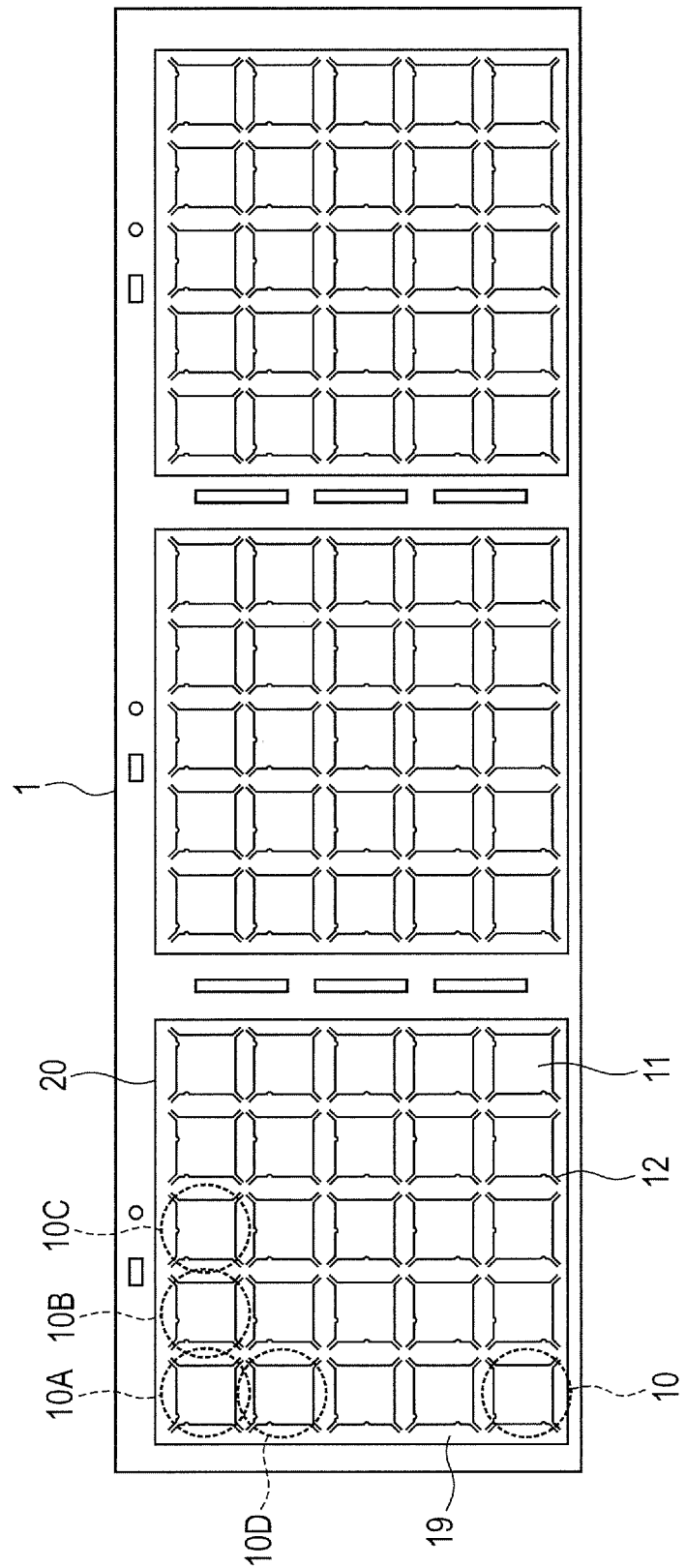

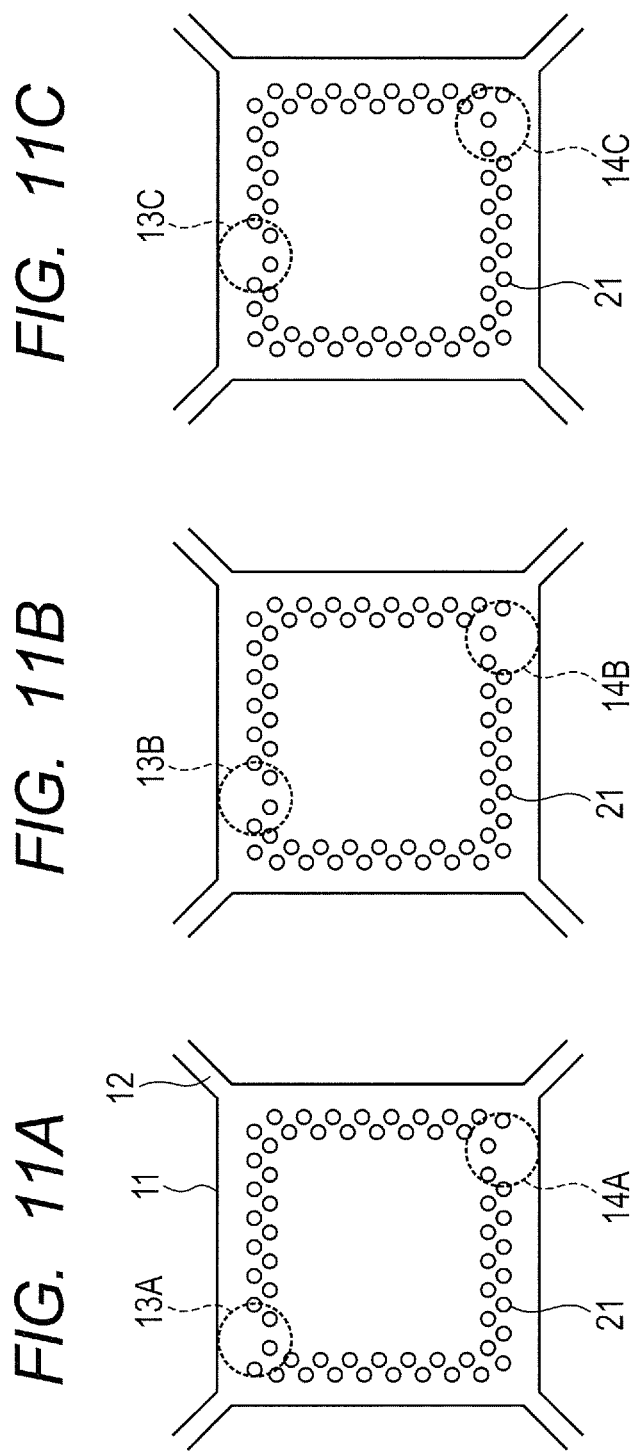

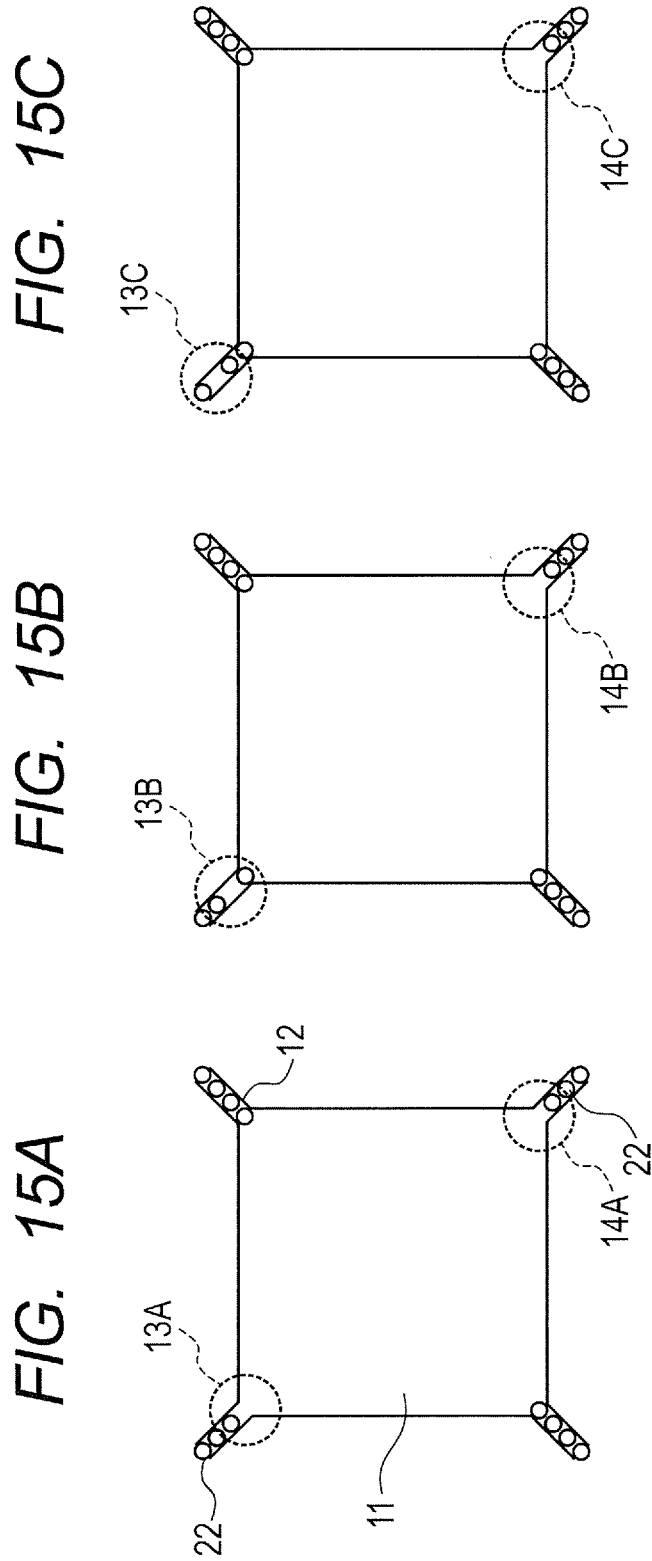

LEAD FRAME, SEMICONDUCTOR DEVICE, METHOD OF MANUFACTURING LEAD FRAME, AND METHOD OF MANUFACTURING SEMICONDUCTOR DEVICE

CROSS-REFERENCE TO RELATED APPLICATIONS

The disclosure of Japanese Patent Application No. 2011-205521 filed on Sep. 21, 2011 including the specification, drawings and abstract is incorporated herein by reference in its entirety.

BACKGROUND

The present invention relates to a lead frame, a semiconductor device, a method of manufacturing a lead frame, and a method of manufacturing a semiconductor device.

A lead frame for QFN (Quad Flat Non-leaded) packages or SON (Small Outline Non-leaded) packages is known in which a plurality of unit lead frames each having one die pad are formed. In the packaging process using such a lead frame, a semiconductor element is mounted over each of the unit lead frames before being resin-sealed and diced into separate unit lead frames.

In the technique which uses this kind of lead frame, it is desirable to provide a means to know where the unit lead frame of each separate semiconductor device after dicing was in the lead frame before dicing.

Japanese Unexamined Patent Publication No. 2004-193189 discloses a technique that for each semiconductor chip in a lead frame carrying a plurality of unit lead frames, the identification code of the semiconductor chip, the identification information of the lead frame carrying the semiconductor chip, the information on the location of the semiconductor chip in the lead frame and their mutual relation are stored and the identification information of the lead frame related to the semiconductor chip and the information on its location in the lead frame are printed on the back of the package of the semiconductor chip.

Japanese Unexamined Patent Publication No. 2003-124365 describes a method of providing semiconductor integrated circuit chip management information which includes the step of recording, for each of plural semiconductor integrated circuit chips formed in a semiconductor wafer, management information related to the manufacturing process of the semiconductor integrated circuit chip (date and time of production of the chip, lot number, wafer number, and location of the chip in the wafer, etc.) and the step of, when mounting a semiconductor integrated circuit chip separated from the semiconductor wafer over a lead frame, printing the management information on the lead frame in the vicinity of the area where the semiconductor integrated circuit chip is mounted.

Japanese Unexamined Patent Publication No. 2001-127236 describes an IC package produced by sealing a tab, inner leads and an IC chip mounted over the tab with transparent resin in which the inner leads have printing regions and a mark representing the manufacturer, a mark representing the product model number and/or a mark representing the manufacturing lot number are printed in the printing regions.

Japanese Unexamined Patent Publication No. Hei 5(1993)-36739 describes a semiconductor device manufacturing apparatus which bonds a semiconductor pellet to a lead frame and includes a printer module for printing the record of a die-bonded pellet on the back of the lead frame island on which the pellet is mounted.

SUMMARY

However, when some information is printed on the back of a package or in a given area of a lead frame as in the above related techniques, it is necessary to add a step of printing the information.

According to a first aspect of the invention, there is provided a lead frame in which a plurality of unit lead frames each having a die pad, suspension leads coupled to the die pad, a lead frame holder coupled to the suspension leads, and leads having one end coupled to the lead frame holder are formed. Here, an identification mark including at least one of a penetrating groove, recess, and convex is formed in at least one of the die pad, the suspension leads, and the leads. The identification mark of a first one of the unit lead frames and the identification mark of a second one of the unit lead frames are different from each other at least either in location in the unit lead frame or in shape.

According to a second aspect of the invention, there is provided a method of manufacturing a lead frame which includes the steps of: providing a metal plate; and etching to remove part of the metal plate after placing a mask with a given pattern on a surface of the metal plate. The given pattern of the mask is designed to form a lead frame in which a plurality of unit lead frames are formed, each unit lead frame having a die pad, suspension leads coupled to the die pad, and leads formed around the die pad. Here an identification mark including at least one of a penetrating groove, recess, and convex is formed in at least one of the die pad, the suspension leads, and the leads. The identification mark of a first one of the unit lead frames and the identification mark of a second one of the unit lead frames are different from each other at least either in location in the unit lead frame or in shape.

Preferably, in the semiconductor device, a semiconductor element is mounted over each of the unit lead frames in the lead frame.

According to a third aspect of the invention, there is provided a semiconductor device which includes: a unit lead frame having a die pad, suspension leads coupled to the die pad, and leads formed around the die pad; a semiconductor element mounted over the unit lead frame; and sealing resin for sealing the unit lead frame and the semiconductor element. Here an identification mark including at least one of a penetrating groove, recess, and convex is formed in at least one of the die pad, the suspension leads, and the leads. The identification marks of at least two of a plurality of the semiconductor devices are different from each other at least either in location in the unit lead frame or in shape.

According to a fourth aspect of the invention, there is provided a method of manufacturing a semiconductor device, which includes the steps of: providing a lead frame in which a plurality of unit lead frames are formed, each unit lead frame having a die pad, suspension leads coupled to the die pad, and leads formed around the die pad; mounting a semiconductor element over each of the die pads; after mounting the semiconductor element, sealing the unit lead frames and the semiconductor elements with sealing resin; and after sealing the unit lead frames and the semiconductor elements, dicing into pieces as the unit lead frames. In the lead frame, an identification mark including at least one of a penetrating groove, recess, and convex is formed in at least one of the die pad, the suspension leads, and the leads. The identification mark of a first one of the unit lead frames and the identification mark of a second one of the unit lead frames are different from each other at least either in location in the unit lead frame or in shape.

In the present invention, a lead frame in which a plurality of unit lead frames each having a die pad, suspension leads coupled to the die pad, and leads formed around the die pad are formed are formed by etching a metal plate. In addition, in the present invention, by the same etching step of forming these, at least one of a penetrating groove, recess, and convex as an identification mark is formed in at least one of the die pad, suspension leads and lead frame holder.

According to the present invention, an identification mark can be given to a unit lead frame without an additional manufacturing step. As a consequence, where the unit lead frame of each separate semiconductor device after dicing was located in the lead frame before dicing can be known.

According to the present invention, where the unit lead frame of each separate semiconductor device after dicing was located in the lead frame before dicing can be known without an additional manufacturing step.

BRIEF DESCRIPTION OF THE DRAWINGS

FIGS. 3A and 3B shows a unit lead frame according to the embodiment, in which FIG. 3A is a schematic plan view and FIG. 3B is a sectional view;

FIG. 8 is a plan view schematically showing the essential part of a lead frame according to the embodiment;

FIGS. 11A to 11C are plan views schematically showing the essential parts of unit lead frames according to the embodiment;

FIGS. 12A and 12B show a unit lead frame according to the embodiment, in which FIG. 12A is a plan view and FIG. 12B is a sectional view;

FIGS. 15A to 15C are plan views schematically showing the essential parts of unit lead frames according to the embodiment;

FIGS. 16A and 16B show a unit lead frame according to the embodiment, in which FIG. 16A is a plan view and FIG. 16B is a sectional view.

DETAILED DESCRIPTION

Figure 1:
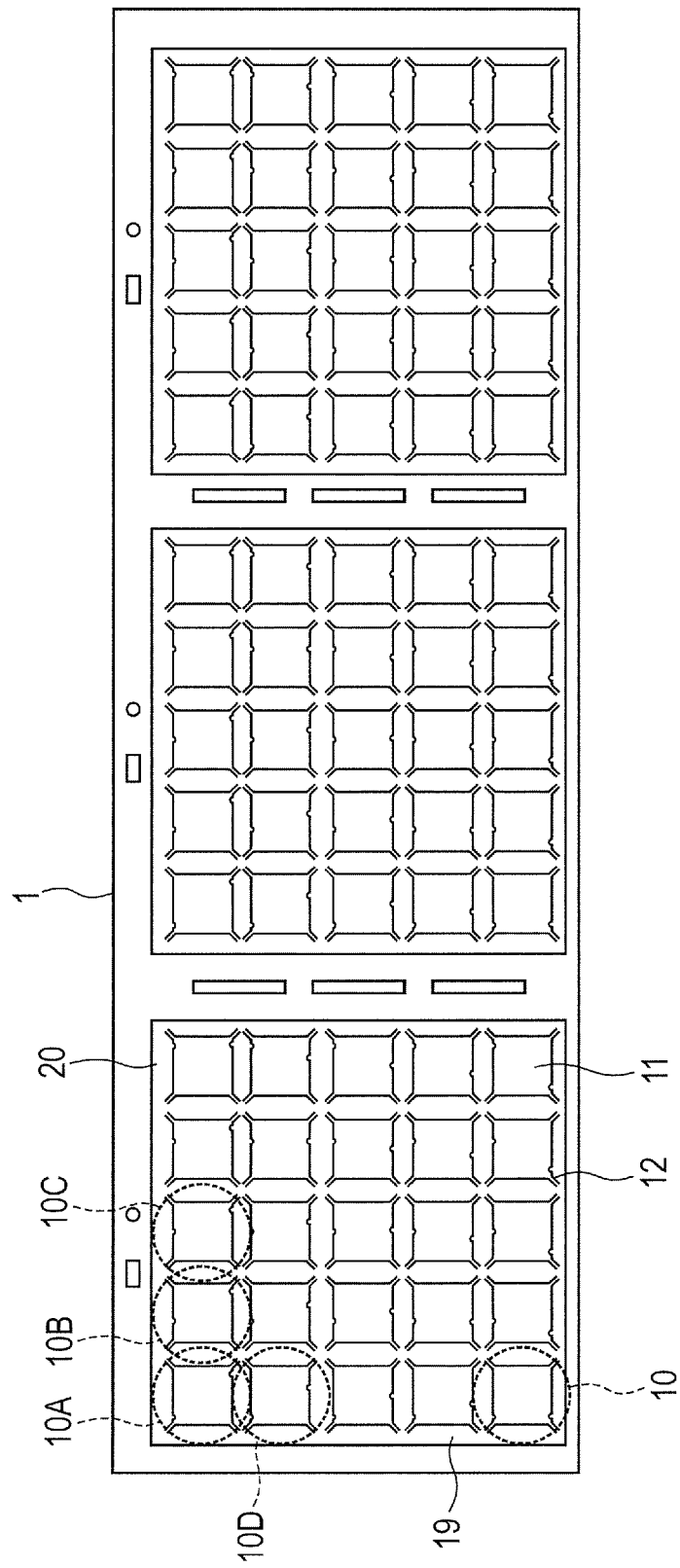
FIG. 1 is a plan view schematically showing the essential part of a lead frame according to an embodiment of the invention.
Figure 2A:
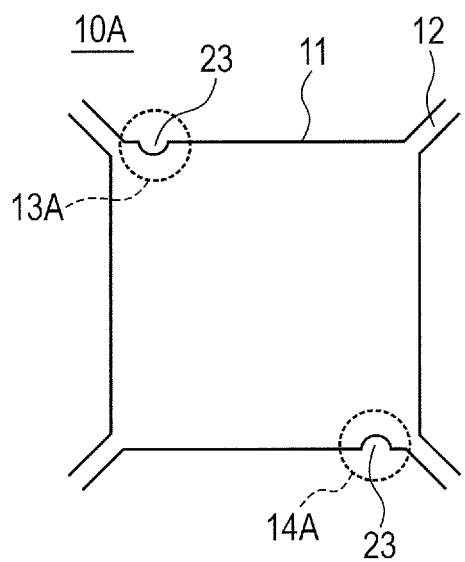
FIGS. 2A to 2D are plan views schematically showing the essential parts of unit lead frames according to the embodiment.
Figure 2B:
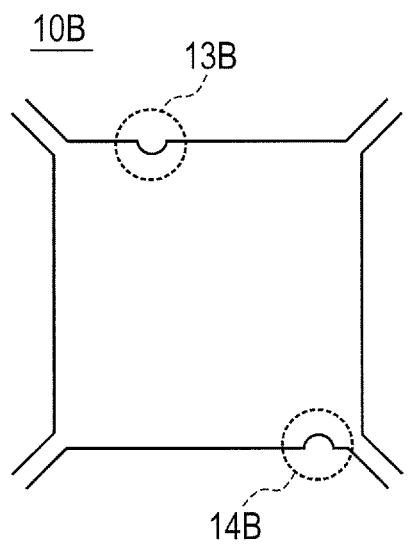
Figure 2C:
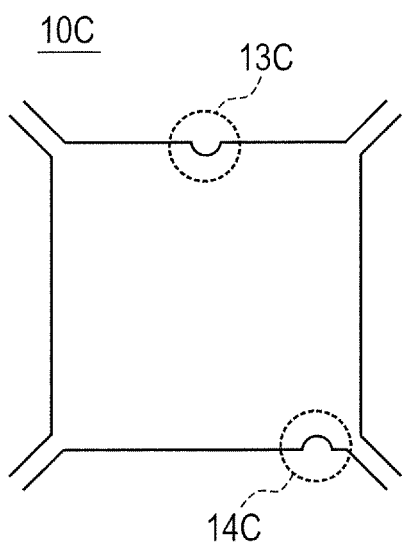
Figure 2D:
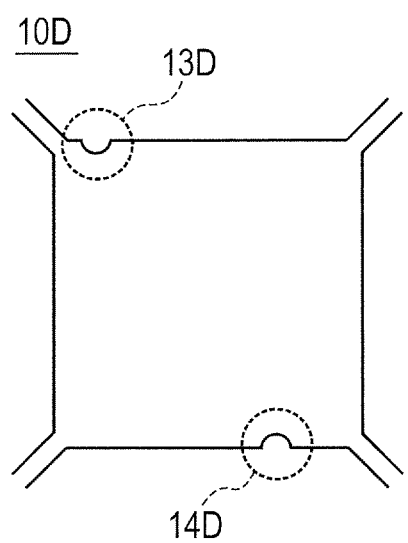

Next, an embodiment of the present invention will be described in detail referring to the accompanying drawings. All the structural drawings given below schematically show the embodiment of the invention and, in terms of dimensions, various constituent elements are illustrated in accordance with the scale ratio used in each of the drawings and the illustrations do not define any structural dimensions of the invention, unless otherwise specified. Like constituent elements are designated by like reference numerals and descriptions thereof are not repeated.

Structure of the Lead Frame

First, the structure of a lead frame according to an embodiment of the invention will be described. FIG. 1 is a plan view schematically showing the essential part of a lead frame 1 according to this embodiment. In the lead frame 1, a plurality of unit lead frames 10 each having a die pad 11, suspension leads 12, and a lead frame holder 19 are formed. The lead frame holder 19 has an opening and the die pad 11, leads (not shown), and four suspension leads 12 are located in the opening. The four suspension leads 12 couple the die pad 11 to the lead frame holder 19 with one end thereof coupled to the die pad 11 and the other end coupled to the lead frame holder 19. The number of suspension leads 12 is not limited to four but it may be two as in the related techniques. The leads are formed around the die pad so that that one end thereof is coupled to the lead frame holder 19 and the other end extends toward the die pad.

The lead frame 1 has three blocks 20 each containing a plurality of unit lead frames 10, in which each block 20 contains 25 unit lead frames 10. The unit lead frames 10 may be arranged in a grid pattern in the blocks 20 as shown in FIG. 1. The number of blocks 20 and the number of unit lead frames 10 in each block 20 are a matter of design choice.

FIGS. 2A to 2D are enlarged schematic views which show the essential parts of unit lead frames 10A to 10D of the lead frame 1 shown in FIG. 1 respectively. As shown in FIGS. 2A to 2D, each die pad 11 has identification marks including two penetrating grooves 23. The penetrating grooves 23 are grooves which penetrate the lead frame 1 from its front surface to its back surface. The shape and size of the penetrating grooves 23 are not limited and may be different from the shape and size shown here.

In this embodiment, the location of each unit lead frame 10 in the block 20 can be known by the identification marks as the two penetrating grooves 23.

Specifically, identification marks 13A to 13D formed on the upper sides of the die pads 11 shown in FIGS. 2A to 2D indicate the columns in which the unit lead frames 10 are located in the block 20 respectively.

More specifically, when M denotes the length of the upper sides of the die pads 11 shown in the figures, the identification mark 13A of the unit lead frame 10A in the first column from the left in the block 20 is located about M/5 away from the left end of the upper side of the die pad 11. The identification mark 13B of the unit lead frame 10B in the second column from the left in the block 20 is located about 2M/5 away from the left end of the upper side of the die pad 11. The identification mark 13C of the unit lead frame 10C in the third column from the left in the block 20 is located about 3M/5 away from the left end of the upper side of the die pad 11. As shown in FIG. 1, the identification marks of the unit lead frames 10 in the fourth and fifth columns from the left in the block 20 are located in accordance with the same rule.

The identification mark 13D of the unit lead frame 10D in the first column from the left in the block 20 is located about M/5 away from the left end of the upper side of the die pad 11, like the identification mark 13A of the unit lead frame 10A.

According to this embodiment, even after the unit lead frames 10 are separated from the lead frame 1, the column in which each unit lead frame 10 was located in the block 20 can be known by checking the location of the identification mark which is made on the upper side of the die pad 11 in accordance with the above rule.

Identification marks 14A to 14D formed on the lower sides of the die pads 11 shown in FIGS. 2A to 2D indicate the rows in which the unit lead frames 10 are located in the block 20 respectively.

More specifically, when M denotes the length of the lower sides of the die pads 11 shown in the figures, the identification mark 14A of the unit lead frame 10A in the first row from the top in the block 20 is located about M/5 away from the right end of the lower side of the die pad 11. The identification mark 14D of the unit lead frame 10D in the second row from the top in the block 20 is located about 2M/5 away from the right end of the lower side of the die pad 11. As shown in FIG. 1, the identification marks of the unit lead frames 10 in the third, fourth, and fifth rows from the top in the block 20 are located in accordance with the same rule.

The identification marks 14B and 14C of the unit lead frames 10B and 10C in the first row from the top in the block 20 are located about M/5 away from the right ends of the lower sides of the respective die pads 11 like the identification mark 14A of the unit lead frame 10A.

According to this embodiment, even after the unit lead frames 10 are separated from the lead frame 1, the row in which each unit lead frame 10 was located in the block 20 can be known by checking the location of the identification mark which is made on the lower side of the die pad 11 in accordance with the above rule.

The above relation between the location of the identification mark in each unit lead frame 10 and the location of the unit lead frame 10 in the block 20 is just an example and another type of relation between them may be adopted.

As shown in FIG. 1, in this embodiment, unit lead frames 10 in different blocks 20 may have the same identification marks. For example, the unit lead frame 10 in the first row and first column of the left block 20 in FIG. 1 has the same identification marks as the unit lead frames 10 in the first row and first column of the center and right blocks 20 in FIG. 1. Despite this, in this embodiment, where the unit lead frame 10 of each separate semiconductor device after dicing was located in each block 20 of the lead frame 1 can be known. For example, by knowing the location of each unit lead frame 10 in the block 20, where it was in the cavity at the resin sealing step in the semiconductor device manufacturing method which will be described later can be known even after the dicing step. Therefore, it is possible to know whether it was on the gate side during resin sealing.

Furthermore, since unit lead frames 10 in different blocks 20 which are located in the same row and same column of the blocks have the same identification marks, in the lead frame manufacturing process which will be described later, for the different blocks a common etching pattern or mask may be used or identification marks may be made under common etching conditions. In addition, even if lead frames are manufactured on the basis of a larger production unit than a lead frame as in the case of the reel-to-reel method, a lead frame with the same quality can be obtained even when the workpiece in any position is picked up.

Figure 3A:
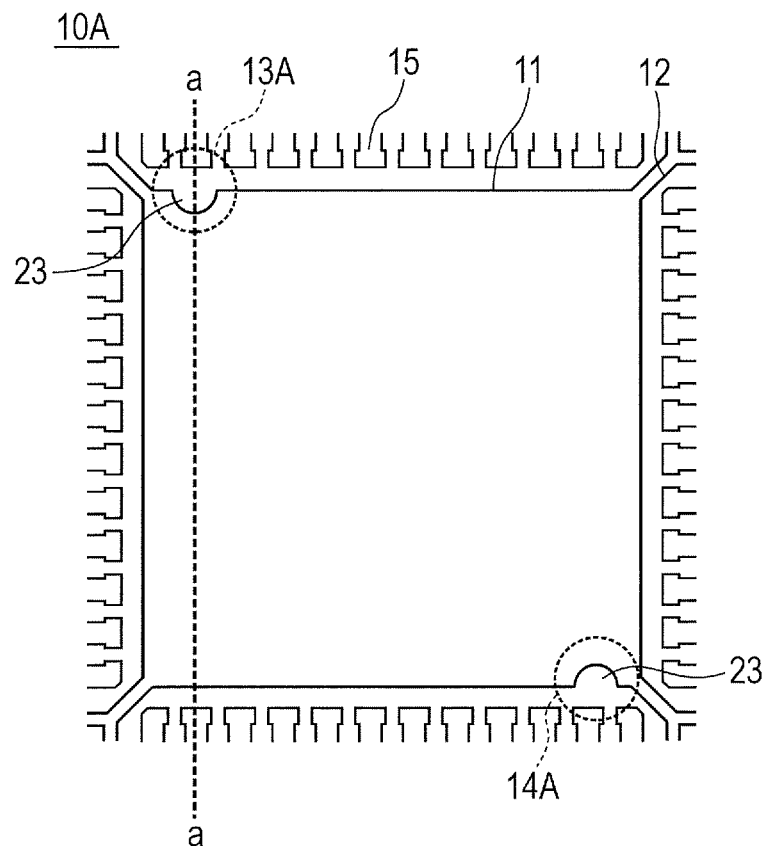

FIG. 3A is a schematic plan view which shows details of the unit lead frame 10A shown in FIG. 1. As shown in FIG. 3A, a plurality of leads 15 are disposed around the die pad 11.

Figure 3B:
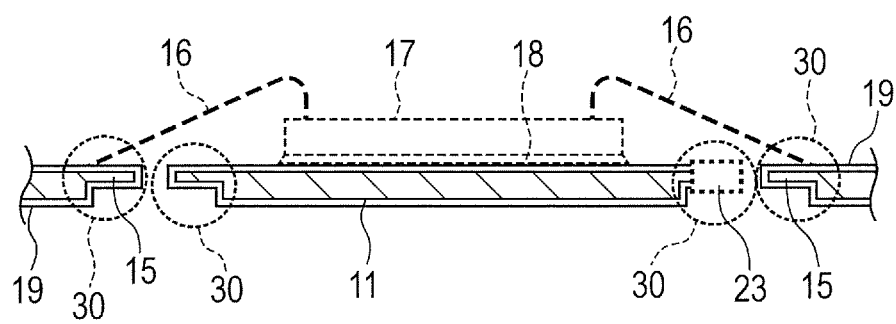

FIG. 3B is a schematic sectional view taken along the a-a line of FIG. 3A. In FIG. 3B, a semiconductor element 17 to be mounted, an adhesive agent 18 and wires 16 for coupling the semiconductor element 17 to the leads 15 are indicated by dotted lines.

As shown in FIG. 3B, the die pad 11 has a thin-walled portion 30 which forms a recess on the side where the semiconductor element 17 is not mounted while the semiconductor element 17 is mounted over the unit lead frame 10A. The same thin-walled portion 30 like this is formed in all the die pads 11. The identification marks are penetrating grooves 23 made by removing part of the thin-walled portion 30.

Method of Manufacturing a Lead Frame

Figure 4:
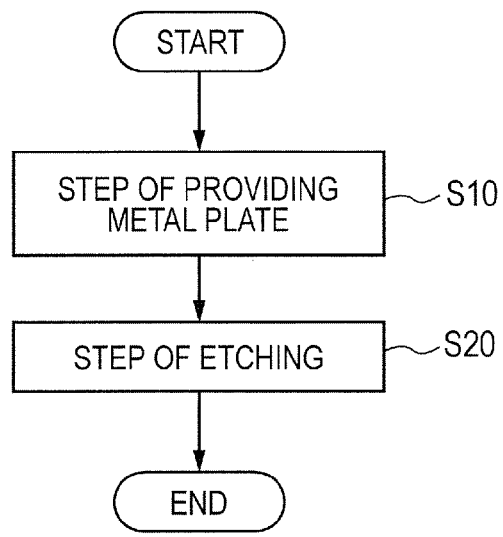
FIG. 4 a flowchart showing a method of manufacturing a lead frame according to the embodiment.

Next, a method of manufacturing the lead frame 1 according to this embodiment will be described referring to the flowchart of FIG. 4. As shown in the flowchart of FIG. 4, the method of manufacturing the lead frame 1 according to this embodiment includes the step of providing a metal plate S10 and the step of etching S20.

At the step of providing a metal plate S10, a metal plate is prepared. The metal plate may be a copper plate, copper alloy plate or any other type of metal plate as used in the related techniques. The thickness and size of the metal plate are a matter of design choice.

At the step of etching S20, a mask having a given pattern is placed on a surface of the metal plate prepared at the step of providing a metal plate S10 before the metal plate is partially removed by etching.

In this embodiment, not only the die pad 11, suspension leads 12, leads 15, and lead frame holder 19 are formed by the etching step but also the identification marks are formed during the same etching step.

The given pattern of the mask is designed to form the lead frame 1 in which a plurality of unit lead frames 10 are formed, each unit lead frame 10 having the die pad 11, suspension leads 12 coupled to the die pad 11, lead frame holder 19 coupled to the suspension leads 12, and leads 15 formed around the die pad with one end coupled to the lead frame holder 19. The given pattern of the mask is also designed to form the identification marks as penetrating grooves 23 in the die pad 11 as shown in FIGS. 2A to 2D.

At the step of etching S20, the metal plate is etched so as to form grooves penetrating the metal plate and non-penetrating recesses to produce the given pattern. This etching process can be carried out by any method as used in the related techniques. While the grooves penetrating the metal plate and the non-penetrating recesses may be formed by one etching cycle or two or more etching cycles, the identification marks are formed during the same etching process in which the die pad 11, suspension leads 12, leads 15, and lead frame holder 19 are formed. By doing so, the identification marks can be formed without an additional step. Alternatively, for example, the etching process may be a process in which after masks with a given pattern are placed on the front and back surfaces of the metal plate, the penetrating grooves and non-penetrating recesses are formed by wet etching in which the metal plate is etched to half its thickness. If that is the case, a penetrating groove is formed in a place where there is an opening in both the masks placed on the front surface and the mask placed on the back surface and a non-penetrating recess is formed in a place where there is an opening in either the mask placed on the front surface or the mask placed on the back surface.

After the step of etching S20, a coating may be made on the lead frame 1 using a method as used in the related techniques, in which the coating may include three layers of Ni, Pd, and Au.

Structure of the Semiconductor Device

Figure 5:
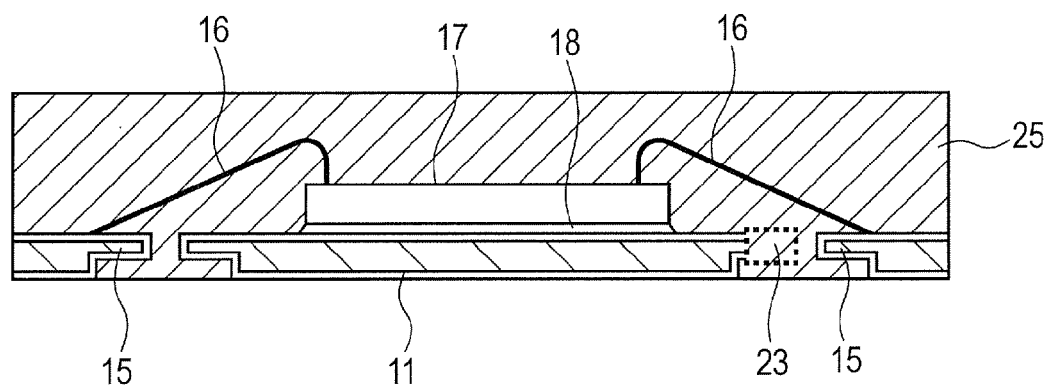
FIG. 5 is a sectional view schematically showing a semiconductor device according to the embodiment.

Next, the structure of a semiconductor device according to this embodiment will be described. FIG. 5 is a schematic sectional view of a semiconductor device according to this embodiment. The semiconductor device according to this embodiment is a semiconductor device in which a semiconductor element 17 is mounted over the above unit lead frame 10 according to this embodiment.

In other words, the semiconductor device according to this embodiment includes: the die pad 11, suspension leads 12 (not shown in FIG. 5), leads 15 around the die pad 11, semiconductor element 17 mounted over the die pad 11, wires 16 for coupling the leads 15 to the semiconductor element 17, and sealing resin 25 for sealing them.

Some portion of the lower surface of the die pad 11 (side opposite to the side where the semiconductor element 17 is formed) and the lower surface of each lead 15 are exposed from the sealing resin 25. The lateral sides of the sealing resin are included in the planes perpendicular to the plane including the die pad 11. The lateral sides of the leads 15 are included in the planes including the lateral sides of the sealing resin 25 and the material of the metal plate which makes the lead frame is exposed.

Identification marks including penetrating grooves 23 are formed in the die pad 11. As for at least two semiconductor devices among a plurality of semiconductor devices, their identification marks are different from each other in terms of location in the unit lead frame 10.

The semiconductor device 17, wires 16 and sealing resin 25 are not limited and may be of any type that is used in the related techniques.

Method of Manufacturing a Semiconductor Device

Figure 6:
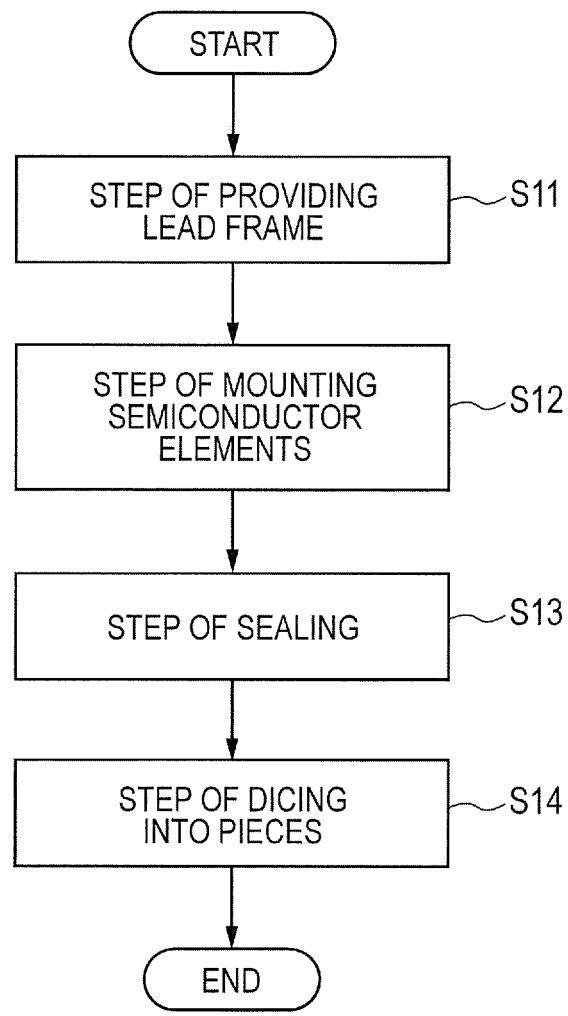
FIG. 6 a flowchart showing a method of manufacturing a semiconductor device according to the embodiment.

Next, the method of manufacturing a semiconductor device according to this embodiment will be described referring to the flowchart of FIG. 6 and FIGS. 7A to 7E. As shown in the flowchart of FIG. 6, the method of manufacturing a semiconductor device according to this embodiment includes the step of providing a lead frame S11, the step of mounting semiconductor elements S12, the step of sealing S13, and the step of dicing into pieces S14.

At the step of providing a lead frame S11, the lead frame 1 according to this embodiment as described above is provided as shown in FIG. 7A. More specifically, the lead frame which is provided is as follows: as shown in FIG. 1, the lead frame 1 has a plurality of unit lead frames 10, each of which includes the die pad 11, suspension leads 12 coupled to the die pad 11, lead frame holder 19 coupled to the suspension leads 12, and leads 15 with one end coupled to the lead frame holder 19, in which the die pad 11 has identification marks including penetrating grooves 23 and the identification mark of a first unit lead frame 10 is different from the identification mark of a second unit lead frame 10 in terms of location in the unit lead frame 10. The first unit lead frame 10 and second unit lead frame 10 are located in the same block 20.

Figure 7A:
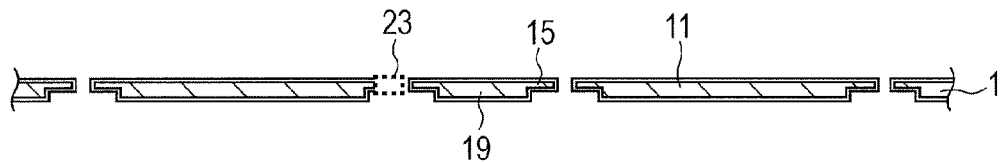
FIGS. 7A to 7E show a work flow of the method of manufacturing a semiconductor device according to the embodiment.
Figure 7B:
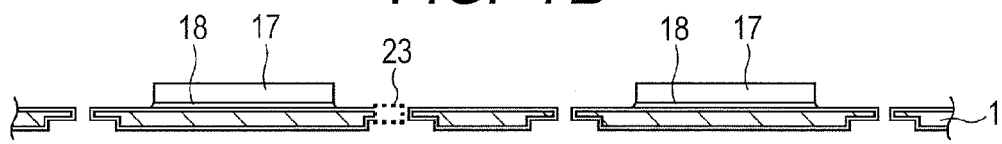
Figure 7C:
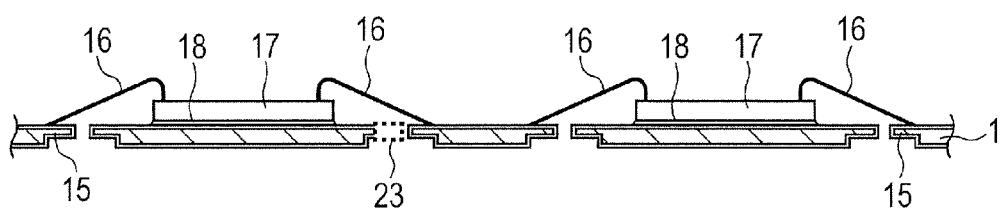

At the step of mounting semiconductor elements S12, a semiconductor element 17 is mounted over each of the plural die pads 11 through an adhesive agent 18 as shown in FIG. 17B. Then, wires 16 for coupling the leads 15 to the semiconductor element 17 are formed as shown in FIG. 7C. The adhesive agent 18 is not limited and may be of any type that is used in the related techniques.

Figure 7D:
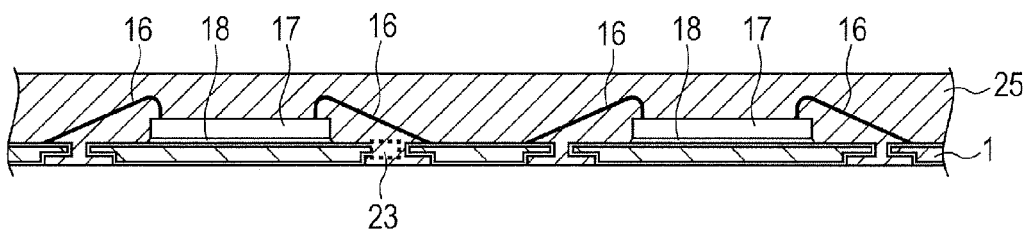

At the step of sealing S13, as shown in FIG. 7D, the die pad 11, suspension leads 12 (not shown in FIG. 7D), leads 15, lead frame holder 19, semiconductor elements 17, and wires 16 are sealed with sealing resin 25.

At the step of sealing S13, the following sealing procedure may be taken: a mold having cavities corresponding to the blocks of the lead frame 1 is placed over the upper surface of the lead frame 1 and unhardened resin is injected through a resin injection hole (gate) made in a lateral side of each cavity, then as the resin hardens, the plural unit lead frames 10 are housed in a single resin block.

If the lead frame 1 is not pre-coated with a Ni—Pd—Au coating, a coating containing Sn may be made on the lower surfaces of the die pad 11 and leads after the step of sealing.

Figure 7E:
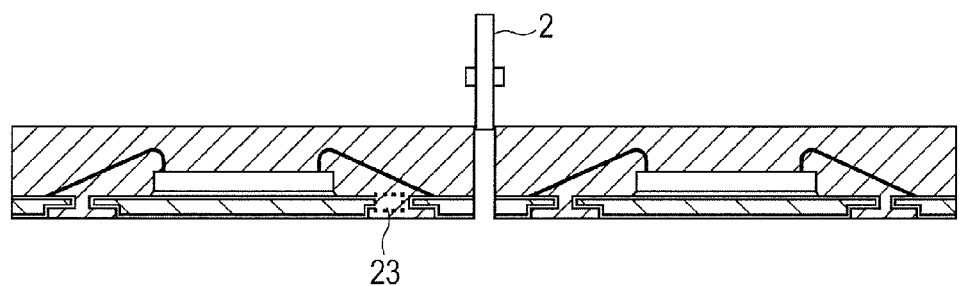
Figure 9A:
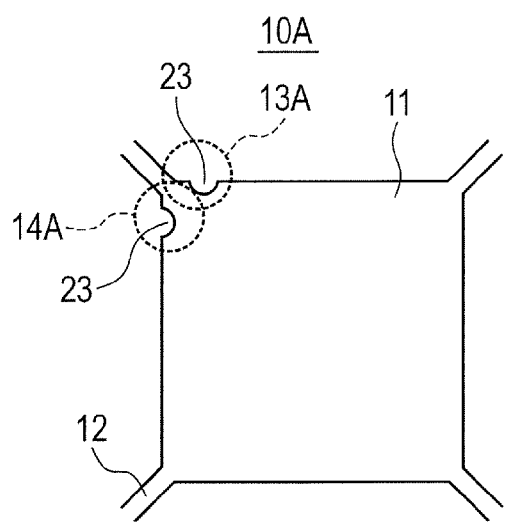
FIGS. 9A to 9D are plan views schematically showing the essential parts of unit lead frames according to the embodiment.
Figure 9B:
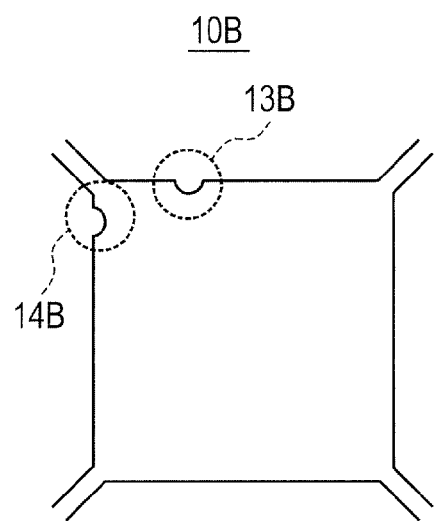
Figure 9C:
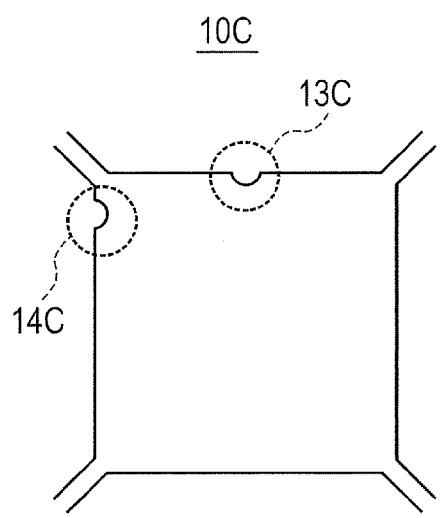
Figure 9D:
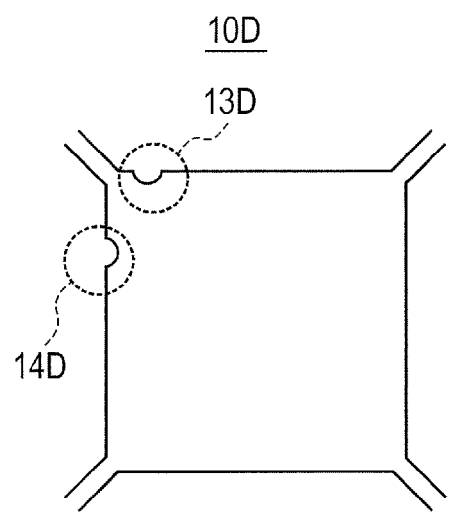

At the step of dicing into pieces S14, the lead frame is divided into separate unit lead frames for semiconductor devices using a dicing device 2 as shown in FIG. 7E. At this time, the leads 15 may be made electrically independent of each other by removing the lead frame holder 19 coupling the leads 15, using the dicing device 2.

Advantageous Effects

As for the semiconductor device which uses the lead frame according to this embodiment, where the unit lead frame 10 of each separate semiconductor device was located in the lead frame 1 before dicing can be known even after dicing by checking the identification mark of the semiconductor device, for example, through an X-ray device.

According to this embodiment, identification marks can be formed in each unit lead frame without an additional manufacturing step. In other words, identification marks can be made in each unit lead frame without disadvantageous effects such as a decline in production efficiency and an increase in production cost.

Furthermore, as for the lead frame according to this embodiment, as shown in FIG. 3B, penetrating grooves 23 which serve as identification marks can be made by partially removing the same thin-walled portions 30 that the die pads 11 have. After sealing with the sealing resin 25, the identification marks are covered by the sealing resin 25 as shown in FIG. 5 and protected from the external environment. Consequently, damage to the identification marks is effectively prevented. Another advantage is that even when the semiconductor devices have different identification marks, they look uniform in appearance.

Furthermore, when the surfaces of the die pad 11 and leads 15 which are exposed from the sealing resin 25 are used as external terminals, the external terminals of the semiconductor devices with different identification marks have the same planar shape, permitting easy substrate mounting and ensuring coupling reliability.

Variations of the Embodiment

The lead frame 1 according to this embodiment includes variations of the above lead frame which can be manufactured by the above method of manufacturing a lead frame. The variations described below offer the same advantageous effects as mentioned above unless otherwise described.

While the location of each unit lead frame 10 in the block 20 can be identified by the locations of the penetrating grooves 23 made in the unit lead frame 10 in the above case, alternatively plural unit lead frames 10 may have penetrating grooves 23 with different shapes so that the location of each unit lead frame 10 in the block 20 can be identified by the shape of its penetrating groove 23.

While the two penetrating grooves 23 made in each unit lead frame 10 have the same shape in the above case, alternatively they may have different shapes. This allows easy discrimination between the penetrating groove 23 indicating the column in which each unit lead frame 10 is located in the block 20 and the penetrating groove 23 indicating the row in which the unit lead frame 10 is located in the block 20.

While penetrating grooves 23 as identification marks are made on the upper and lower sides of the die pad 11 in FIGS. 2A to 2D, alternatively penetrating grooves 23 may be made on the right and left sides of the die pad 11 in FIGS. 2A to 2D.

Furthermore, penetrating grooves 23 as identification marks may be made in the suspension leads 12 and/or lead frame holder 19.

Furthermore, a recess and/or convex may be made in at least one of the die pad 11, suspension leads 12 and lead frame holder 19.

While in the above case the column and row in which each unit lead frame 10 is located in the block 20 can be identified by two identification marks made in the unit lead frame 10, alternatively arrangements may be made so that the column and row can be identified by one identification mark. In other words, it is possible that each of the unit lead frames 10 in the same block 20 is identified by one identification mark.

Furthermore, in addition to information for identifying the location of each unit lead frame 10 in a block 20, information that indicates in which block 20 each unit lead frame 10 is located (hereinafter referred to as "block information") can be provided in the unit lead frame. Like the above identification marks, the block information may include at least one of a penetrating groove, recess, and convex which is made in at least one of the die pad 11, suspension leads 12 and leads around the die pad 11. One example is as follows: a penetrating groove made in the die pad 11 is used to identify the location of a unit lead frame 10 in a block 20 and a penetrating groove made in a suspension lead 12 is used to identify in which block 20 the unit lead frame 10 is located.

Although the above case assumes that the collective sealing method is applied to the lead frame 1, instead the individual sealing method may be applied to the lead frame 1. If the latter method is applied, the identification marks are used not to identify the location of each unit lead frame 10 in a block 20 of the lead frame 1 but to identify its location in the entire lead frame 1. If unit lead frames 10 are arranged in a grid pattern in the lead frame 1, the location of each unit lead frame 10 in the entire lead frame 1 can be identified in the same way as when the location of each unit lead frame 10 in the block 20 is identified.

Several variations of the lead frame 1 according to this embodiment have been described above. In other words, the lead frame 1 includes any type of lead frame 1 that has, as information for identifying the location of each unit lead frame 10 in the lead frame 1, identification marks made by the step of etching S20 in the method of manufacturing a lead frame according to this embodiment. The identification marks made at the step of etching S20 include at least one of a penetrating groove, recess, and convex which is made in at least one of the die pad 11, suspension leads 12 and leads 15 around the die pad 11. The identification mark of a first unit lead frame 10 and the identification mark of a second unit lead frame 10 are different from each other at least either in location in the unit lead frame 10 or in shape.

Next, variations of the lead frame 1 according to this embodiment will be described in more detail referring to the drawings.

First Variation

First, a first variation is shown in FIG. 8 and FIGS. 9A to 9D. FIG. 8 is a plan view schematically showing the essential part of the first variation lead frame 1. FIGS. 9A to 9D are enlarged schematic views which show the essential parts of the unit lead frames 10A to 10D of the lead frame 1 shown in FIG. 8.

The lead frame 1 shown in FIG. 8 and FIGS. 9A to 9D are structurally the same as the lead frame 1 shown in FIG. 1 and FIGS. 2A to 2D except the locations of the identification marks 14A to 14D for identifying the rows in which the unit lead frames 10 are located. More specifically, in the variation shown in FIGS. 9A to 9D, the identification marks 14A to 14D are made on the left side of the die pad 11.

In this variation, when L denotes the length of the left sides of the die pads 11 shown in the figures, the identification mark 14A of the unit lead frame 10A in the first row from the top in the block 20 is located about L/5 away from the upper end of the left side of the die pad 11. The identification mark 14D of the unit lead frame 10D in the second row from the top in the block 20 is located about 2L/5 away from the upper end of the left side of the die pad 11. As shown in FIG. 8, the identification marks of the unit lead frames 10 in the third, fourth, and fifth rows from the top in the block 20 are located in accordance with the same rule.

The identification marks 14B and 14C of the unit lead frames 10B and 10C in the first row from the top in the block 20 are located about L/5 away from the upper end of the left side of the die pad 11 like the identification mark 14A of the unit lead frame 10A.

According to this variation, even after the unit lead frames 10 are separated from the lead frame 1, the row in which each unit lead frame 10 was located in the block 20 can be known by checking the location of the identification mark which is made on the left side of the die pad 11 in accordance with the above rule.

Also, according to this variation, from the positional relationship between the two penetrating grooves 23 the user can easily know which one of the two penetrating grooves 23 indicates the row or column of each unit lead frame 10 in the block 20. If the user looks at the two penetrating grooves 23 while the upper and left sides having the penetrating grooves 23 are up and left respectively, the user can intuitively recognize the column and row in which each unit lead frame 10 is located in the block 20.

The lead frame in this variation can be manufactured in accordance with the above method of manufacturing a lead frame according to this embodiment.

The semiconductor device in this variation is a semiconductor device in which a semiconductor element 17 is mounted over the above unit lead frame 10 in this variation. The semiconductor device in this variation can be manufactured in accordance with the above method of manufacturing a semiconductor device according to this embodiment.

Second Variation

Figure 10C:
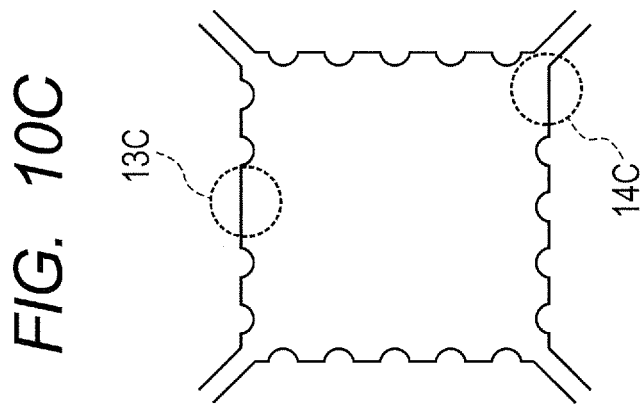
FIGS. 10A to 10C are plan views schematically showing the essential parts of unit lead frames according to the embodiment.
Figure 10B:
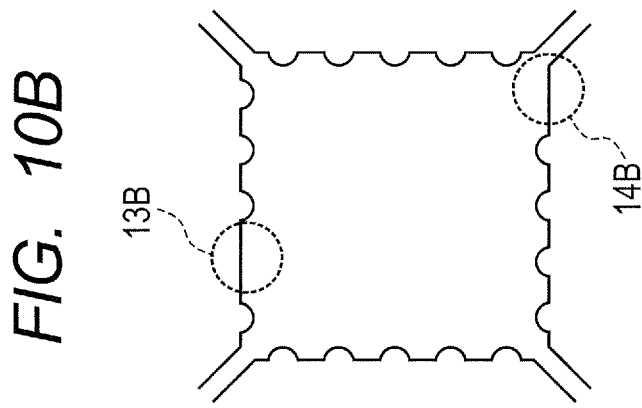
Figure 10A:
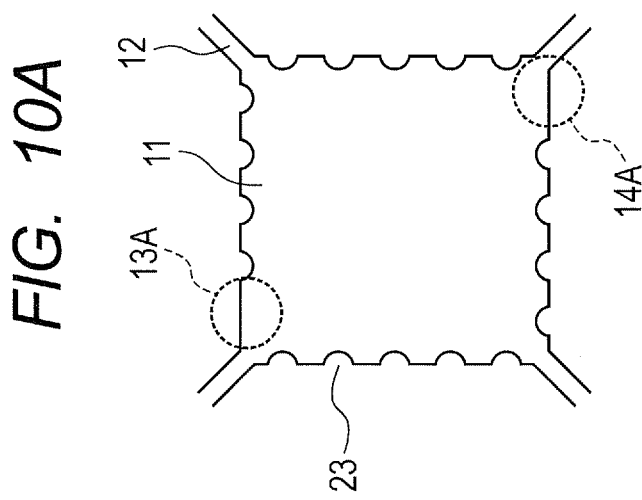

FIGS. 10A to 10C show a second variation. FIGS. 10A to 10C are enlarged schematic views which show the essential parts of some of the unit lead frames 10 of the lead frame 1.

In this variation, a plurality of penetrating grooves 23 are made along the circumference of the die pad 11 at regular intervals except spots where the regularity is lost (spots where a penetrating groove 23 should exist according to the interval regularity rule but no penetrating groove 23 exists) so that the location of the unit lead frame 10 in the lead frame 1 can be identified.

The lead frame 1 in this variation can be manufactured in accordance with the above method of manufacturing a lead frame according to this embodiment.

The semiconductor device in this variation is a semiconductor device in which a semiconductor element 17 is mounted over the above unit lead frame 10 in this variation. The semiconductor device in this variation can be manufactured in accordance with the above method of manufacturing a semiconductor device according to this embodiment.

Third Variation

Figure 12A:
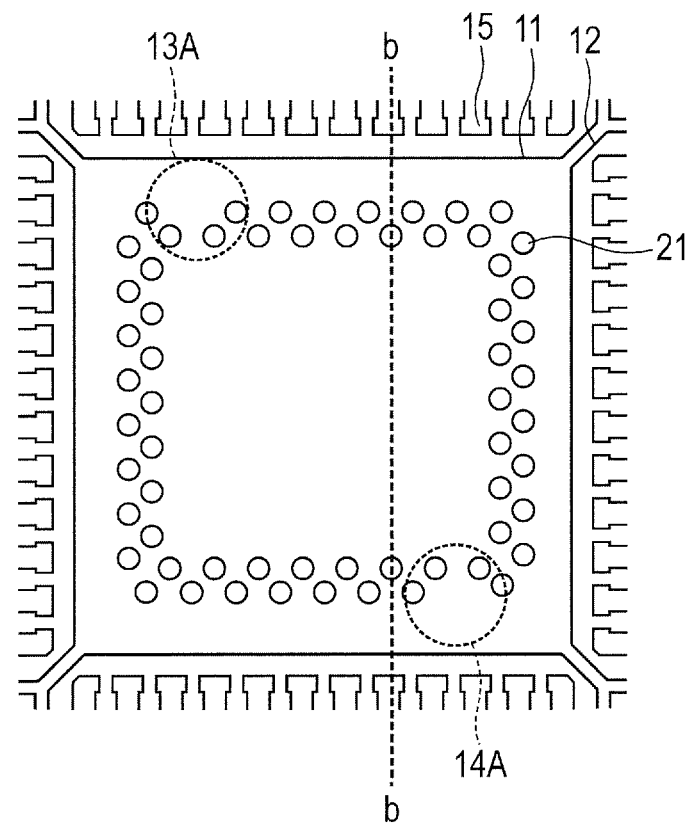
Figure 12B:
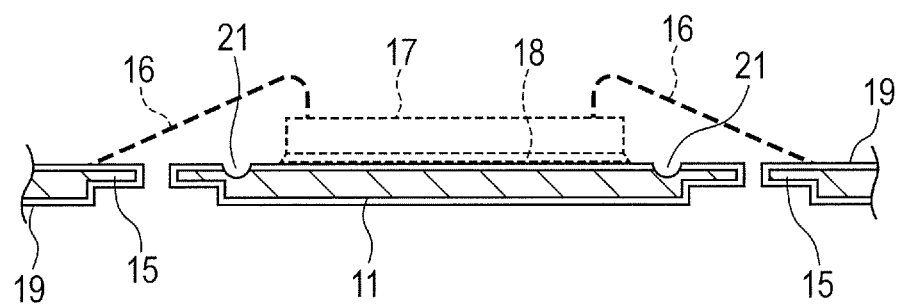

FIGS. 11A to 11C and FIGS. 12A and 12B show a third variation. FIGS. 11A to 11C are enlarged schematic views which show the essential parts of some of the unit lead frames 10 of the lead frame 1. FIG. 12A is a schematic plan view which shows details of the unit lead frame 10 shown in FIG. 11A. FIG. 12B is a schematic sectional view taken along the b-b line of FIG. 12A. In FIG. 12B, a semiconductor element 17 to be mounted, an adhesive agent 18, and wires 16 for coupling the semiconductor element 17 to leads 15 are indicated by dotted lines.

In this variation, an identification mark includes a recess 21 made in the surface of the die pad 11 over which the semiconductor element 17 is mounted. At least part of the recess 21 does not overlap the semiconductor element 17 with the semiconductor element 17 mounted over the unit lead frame 10 in a plan view.

In this variation, a plurality of recesses 21 are made in the die pad 11 in a double frame pattern at regular intervals except spots in the outer frame where the regularity is lost (spots where a recess 21 should exist according to the interval regularity rule but no recess 21 exists) so that the location of the unit lead frame 10 in the lead frame 1 can be identified.

The lead frame in this variation can be manufactured in accordance with the above method of manufacturing a lead frame according to this embodiment.

Figure 13:
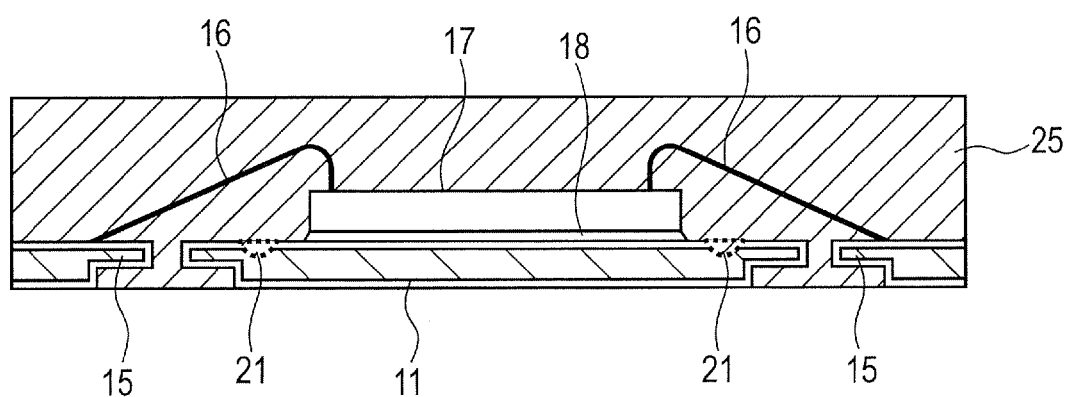
FIG. 13 is a sectional view schematically showing a semiconductor device according to the embodiment.

FIG. 13 is a schematic sectional view of the semiconductor device in this variation. The semiconductor device in this variation is a semiconductor device in which a semiconductor element 17 is mounted over the above unit lead frame 10 in this variation.

In this variation, since an identification mark includes a recess made in the surface of the die pad 11 over which the semiconductor element is mounted, after sealing with sealing resin 25 the identification marks are covered by the sealing resin 25 as shown in FIG. 13 and protected from the external environment. As a consequence, damage to the identification marks is effectively prevented. Another advantage is that even when the semiconductor devices have different identification marks, they look uniform in appearance.

In this variation, an identification mark includes a recess 21 made in the surface of the die pad 11 over which the semiconductor element 17 is mounted and at least part of the recess 21 does not overlap the semiconductor element 17 with the semiconductor element 17 mounted over the unit lead frame 10 in a plan view. The existence of this recess 21 increases the area of contact between the sealing resin 25 and die pad 11, resulting in better adhesion of the sealing resin 25.

The semiconductor device in this variation can be manufactured in accordance with the above method of manufacturing a semiconductor device according to this embodiment.

Alternatively a convex may be made in place of the recess 21 and if that is the case, the same advantageous effects can be achieved. Also, the variation may be such that recesses 21 and/or convexes are made in the surface bearing the suspension leads 12 and/or leads 15 on the side where the semiconductor element 17 is located with the semiconductor element 17 mounted over the unit lead frame 10. In that case, the same advantageous effects can also be achieved.

Fourth Variation

FIGS. 14A to 14C and FIGS. 15A to 15C show a fourth variation. FIGS. 14A to 14C and FIGS. 15A to 15C are enlarged schematic views which show the essential parts of some of the unit lead frames 10 of the lead frame 1.

Figure 14C:
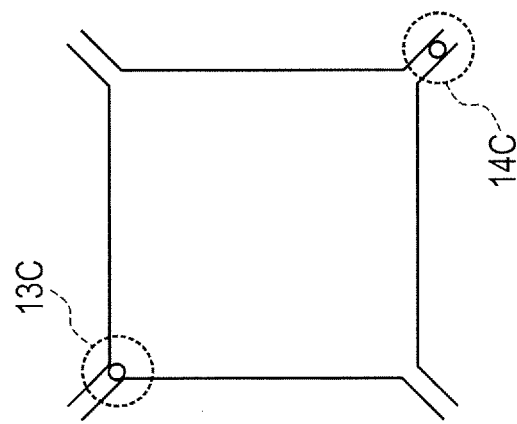
FIGS. 14A to 14C are plan views schematically showing the essential parts of unit lead frames according to the embodiment.
Figure 14B:
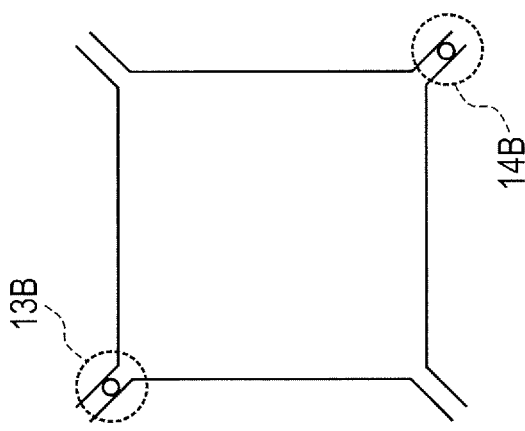
Figure 14A:
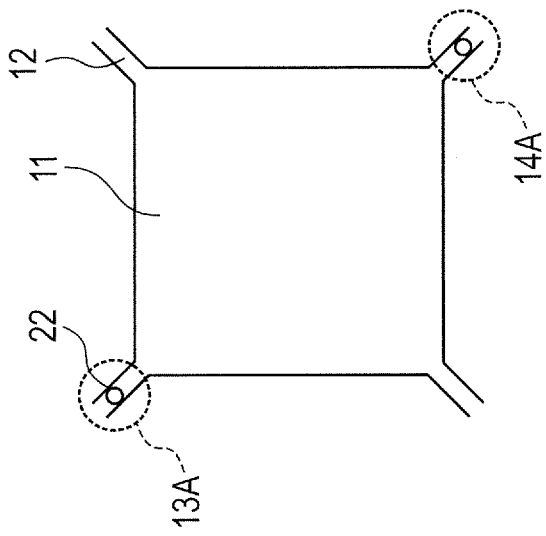

In the example shown in FIGS. 14A to 14C, the location of a unit lead frame 10 in the lead frame 1 can be identified by the location of penetrating grooves 22 made in suspension leads 12 (distance from the die pad 11).

In the example shown in FIGS. 15A to 15C, a plurality of penetrating grooves 22 are made in the suspension leads 12 at regular intervals except spots where the regularity is lost (regularity in the distance from the die pad 11) so that the location of the unit lead frame 10 in the lead frame 1 can be identified.

Figure 16A:
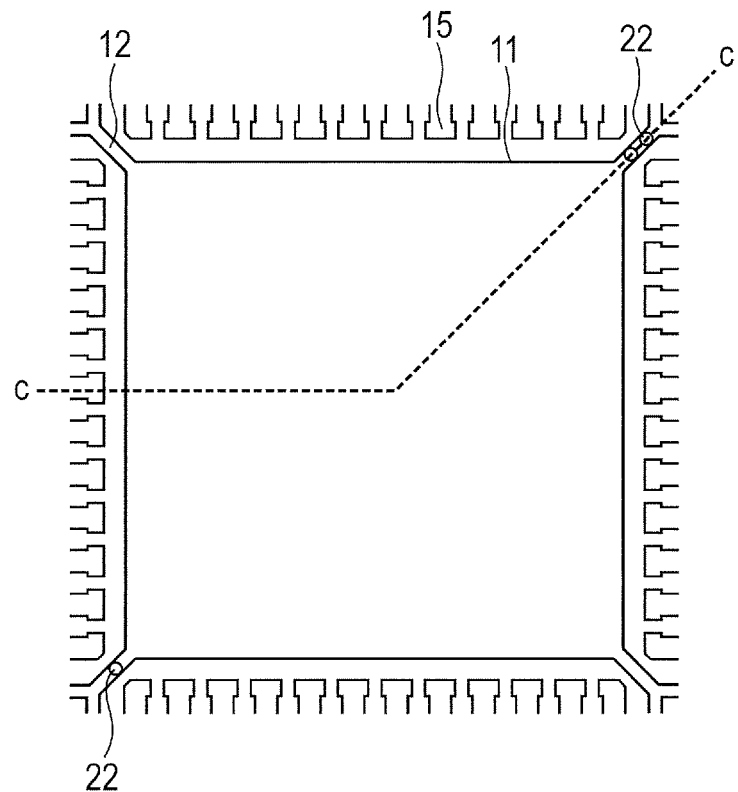
Figure 16B:
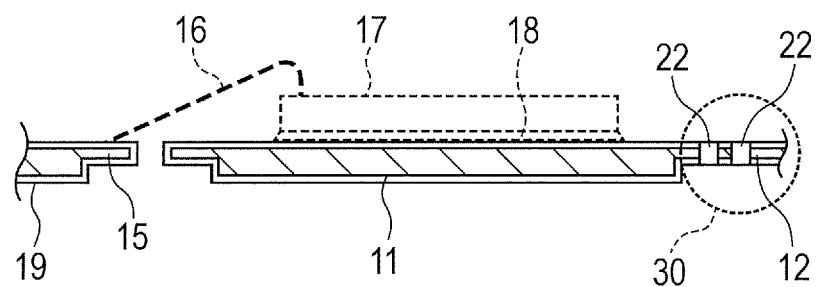

FIG. 16A is a schematic plan view which shows details of a unit lead frame 10 in the fourth variation in which penetrating grooves 22 as identification marks are made in suspension leads 12. FIG. 16B is a schematic sectional view taken along the c-c line of FIG. 16A. In FIG. 16B, a semiconductor element 17 to be mounted, an adhesive agent 18, and wires 16 for coupling the semiconductor element 17 to leads 15 are indicated by dotted lines.

In the example shown in FIG. 16B, each suspension lead 12 has a thin-walled portion 30 which is a recess on the side where the semiconductor element 17 is not located while the semiconductor element 17 is mounted over the unit lead frame 10A. All the suspension leads 12 have the same thin-walled portion 30 like this. The identification marks are penetrating grooves 22 made by removing part of the thin-walled portion 30.

The lead frame in this variation can be manufactured in accordance with the above method of manufacturing a lead frame according to this embodiment.

The semiconductor device in this variation is semiconductor device in which a semiconductor element 17 is mounted over the above unit lead frame 10 in this variation. The semiconductor device in this variation can be manufactured in accordance with the above method of manufacturing a semiconductor device according to this embodiment.

Fifth Variation

Figure 17:
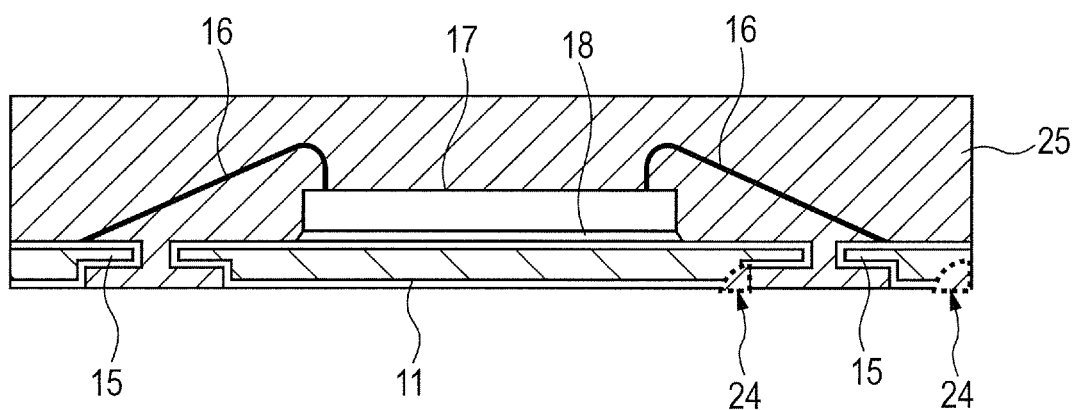
FIG. 17 is a sectional view schematically showing a semiconductor device according to the embodiment.

FIG. 17 shows a fifth variation. FIG. 17 is a schematic sectional view of a semiconductor device in the fifth variation.

In the lead frame 1 in this variation, an identification mark includes a recess 24 made in at least one of the die pad 11, suspension leads 12, and leads 15 on the side opposite to the side where a semiconductor element 17 is located while the semiconductor element 17 is mounted over the unit lead frame 10.

If the semiconductor element 17 is mounted over the unit lead frame 10 in this variation, the identification mark is exposed to the external environment after sealing with the sealing resin 25. Therefore, this variation may have a disadvantage that the identification mark is easily affected by the external environment and semiconductor devices have different external appearances.

However, even in this variation, even after each unit lead frame 10 is separated from the lead frame 1, where the unit lead frame 10 was located in the lead frame 1 can be known by checking its identification mark. In addition, the identification mark is on the outside of the semiconductor device, it can be observed without using an X-ray device.

In this variation, a penetrating groove to be exposed to the external environment after sealing may be made in at least one of the die pad 11, suspension leads 12, and leads 15 in place of the recess 24. Even in this case, the same advantageous effects as above can be achieved.

Also, according to the present application, invention described as follow are also available.

(1) A method of manufacturing a lead frame, comprising the steps of:
providing a metal plate; and
etching to remove part of the metal plate after placing a mask with a given pattern over a surface of the metal plate,
wherein the given pattern of the mask is designed to form a lead frame in which a plurality of unit lead frames are formed, each unit lead frame having a die pad, suspension leads coupled to the die pad, and a lead frame holder coupled to the suspension leads,
wherein an identification mark including at least one of a penetrating groove, recess, and convex is formed in at least one of the die pad, the suspension leads, and the lead frame holder, and
wherein the identification mark of a first one of the unit lead frames and the identification mark of a second one of the unit lead frames are different from each other at least either in location in the unit lead frame or in shape.

What is claimed is:

1. A lead frame comprising plurality of unit lead frames formed therein,
each of the unit lead frames including:
a die pad;
suspension leads coupled to the die pad; and
leads formed around the die pad are formed,
wherein an identification mark including at least one of a penetrating groove, recess, and convex is formed in at least one of the die pad, the suspension leads, and the leads, and
wherein the identification mark of a first one of the unit lead frames and the identification mark of a second one of the unit lead frames are different from each other at least either in location in the unit lead frame or in shape.

2. The lead frame according to claim 1,
wherein the identification mark includes at least one of a recess and convex made in a surface of at least one of the die pad, the suspension leads, and the leads, and
wherein the surface is on a side where, with a semiconductor element mounted over the unit lead frame, the semiconductor element is located.

3. The lead frame according to claim 2, wherein in a plan view of the unit lead frame with the semiconductor element mounted thereover, at least part of the recess or the convex does not overlap the semiconductor element.

4. The lead frame according to claim 1,
wherein at least one of the die pad, the suspension leads, and the leads has a thin-walled portion as a recess in part of a surface on a side where, with a semiconductor element mounted over the unit lead frame, the semiconductor element is not located, and
wherein the identification mark includes a penetrating groove made by removing part of the thin-walled portion.

5. The lead frame according to claim 4, wherein the lead frame includes a plurality of blocks each having a plurality of the unit lead frames, and the first unit lead frame and the second unit lead frame are both located in one of the blocks.

6. The lead frame according to claim 5,
wherein the unit lead frames are arranged in a grid pattern in the blocks, and
wherein the identification marks of the unit lead frames which are in the same location in the blocks are the same in location in the unit lead frame and in shape.

7. The lead frame according to claim 6, wherein the location in the unit lead frame of the identification mark of the unit lead frame which is located right of the first unit lead frame in the block is right of the location of the identification mark of the first unit lead frame in the unit lead frame.

8. The lead frame according to claim 7, wherein the location in the unit lead frame of the identification mark of the unit lead frame which is located under the first unit lead frame in the block is under the location of the identification mark of the first unit lead frame in the unit lead frame.

9. The semiconductor device according to claim 1, wherein a semiconductor element is mounted over each of the unit lead frames of the lead frame.

10. The semiconductor device according to claim 8, wherein a semiconductor element is mounted over each of the unit lead frames of the lead frame.

11. A semiconductor device comprising:
a unit lead frame having a die pad, suspension leads coupled to the die pad, and leads formed around the die pad;
a semiconductor element mounted over the die pad of the unit lead frame; and
sealing resin for sealing the unit lead frame and the semiconductor element,
wherein an identification mark including at least one of a penetrating groove, recess, and convex is formed in at least one of the die pad, the suspension leads, and the leads, and
wherein the identification marks of at least two of a plurality of the semiconductor devices are different from each other at least either in location in the unit lead frame or in shape.

12. The semiconductor device according to claim 11, wherein the identification marks of at least two of the semiconductor devices are the same in location in the unit lead frame and in shape.

13. The semiconductor device according to claim 11,
wherein the identification mark includes at least one of a recess and convex made in a surface of at least one of the die pad, the suspension leads, and the leads, and
wherein the surface is on a side where, with a semiconductor element mounted over the unit lead frame, the semiconductor element is located.

14. The semiconductor device according to claim 13, wherein in a plan view of the unit lead frame with the semiconductor element mounted thereover, at least part of the recess or the convex does not overlap the semiconductor element.

15. The semiconductor device according to claim 11,
wherein at least one of the die pad, the suspension leads, and the leads has a thin-walled portion as a recess in part of a surface on a side where, with a semiconductor element mounted over the unit lead frame, the semiconductor element is not located, and
wherein the identification mark includes a penetrating groove made by removing part of the thin-walled portion.

16. A method of manufacturing a semiconductor device, comprising the steps of:

provide a lead frame in which a plurality of unit lead frames are formed, each unit lead frame having a die pad, suspension leads coupled to the die pad, and leads formed around the die pad;

mounting a semiconductor element over each of a plurality of the die pads;

after mounting the semiconductor element, sealing the unit lead frames and the semiconductor elements with sealing resin; and after sealing the unit lead frames and the semiconductor elements, dicing into pieces as the unit lead frames, wherein in the lead frame, an identification mark including at least one of a penetrating groove, recess, and convex is formed in at least one of the die pad, the suspension leads, and the leads, and wherein the identification mark of a first one of the unit lead frames and the identification mark of a second one of the unit lead frames are different from each other at least either in location in the unit lead frame or in shape.

17. The method of manufacturing a semiconductor device according to claim 16, wherein the identification mark includes at least one of a recess and convex made in a surface of at least one of the die pad, the suspension leads, and the leads, and wherein the surface is on a side where, with a semiconductor element mounted over the unit lead frame, the semiconductor element is located.

18. The method of manufacturing a semiconductor device according to claim 17, wherein in a plan view of the unit lead frame with the semiconductor element mounted thereover, at least part of the recess or the convex does not overlap the semiconductor element.

19. The method of manufacturing a semiconductor device according to claim 18, wherein at least one of the die pad, the suspension leads, and the leads has a thin-walled portion as a recess in part of a surface on a side where, with a semiconductor element mounted over the unit lead frame, the semiconductor element is not located, and wherein the identification mark includes a penetrating groove made by removing part of the thin-walled portion.

20. The method of manufacturing a semiconductor device according to claim 19, wherein the lead frame includes a plurality of blocks each having a plurality of the unit lead frames, and the first unit lead frame and the second unit lead frame are both located in one of the blocks.

21. The method of manufacturing a semiconductor device according to claim 20, wherein the unit lead frames are arranged in a grid pattern in the blocks, and wherein the identification marks of the unit lead frames which are in the same location in the blocks are the same in location in the unit lead frame and in shape.

22. The method of manufacturing a semiconductor device according to claim 21, wherein the location in the unit lead frame of the identification mark of the unit lead frame which is located right of the first unit lead frame in the block is right of the location of the identification mark of the first unit lead frame in the unit lead frame.

23. The method of manufacturing a semiconductor device according to claim 22, wherein the location in the unit lead frame of the identification mark of the unit lead frame which is located under the first unit lead frame in the block is under the location of the identification mark of the first unit lead frame in the block.

* * * * *